United States Patent [19]

Radermacher et al.

[11] Patent Number: 4,701,717
[45] Date of Patent: Oct. 20, 1987

[54] OPERATING POINT-STABILIZED LINEARIZED TRAVELING WAVE TUBE AMPLIFIER

[75] Inventors: Wilhelm Radermacher, Sindelfingen-Maichingen; Johannes Czech, Allmersbach im Tal, both of Fed. Rep. of Germany

[73] Assignee: ANT Nachrichtentechnik GmbH, Backnang, Fed. Rep. of Germany

[21] Appl. No.: 876,936

[22] Filed: Jun. 20, 1986

[30] Foreign Application Priority Data

Jun. 22, 1985 [DE] Fed. Rep. of Germany ....... 3522408

[51] Int. Cl.$^4$ .............................................. H03F 1/33
[52] U.S. Cl. .................................... 330/149; 330/43; 330/284; 328/163
[58] Field of Search .................. 328/163; 330/43, 149, 330/150, 151, 284, 302; 333/18

[56] References Cited

U.S. PATENT DOCUMENTS 4,329,655 5/1982 Nojima et al. ...................... 330/149

FOREIGN PATENT DOCUMENTS 0047825 10/1984 European Pat. Off. .

OTHER PUBLICATIONS

G. Satoh et al., "Nonlinear Satellite Channel Design for QPSK/TDMA Transmission", 5th International Conference of Digital Satellite Communications, Mar. 23-26, 1981, Genoa, Italy, pp. 1-8.

Primary Examiner—Eugene R. LaRoche
Assistant Examiner—Steven J. Mottola
Attorney, Agent, or Firm—Spencer & Frank

[57] ABSTRACT

A traveling wave tube transmission amplifier arrangement, including the series connection of a predistortion circuit, a preamplifier with limiter circuit and a traveling wave tube amplifier, which is provided with several stabilizing circuits. To limit the output power, a signal which is a measure of the output power of the traveling wave tube, e.g., a signal proportional to the collector current of the traveling wave tube, is fed to a threshold controller which governs a variable attenuator provided at the input of the transmission amplifier arrangement. Moreover, to provide compensation for aging effects, a remote control signal, which is determined on the basis of an intermodulation measurement, is fed to the preamplifier with limiter circuit.

11 Claims, 6 Drawing Figures

OPERATING POINT-STABILIZED LINEARIZED TRAVELING WAVE TUBE AMPLIFIER

BACKGROUND OF THE INVENTION

This invention relates to a traveling wave tube amplifier arrangement. More particularly, the present invention relates to an operating point stabilized, linearized traveling wave tube transmission amplifier arrangement including a traveling wave tube amplifier having a predistortion circuit for providing compensation for the non-linearities in the traveling wave tube amplifier and a preamplifier with a limiter connected in series with the amplifier input.

To compensate for the non-linearities in traveling wave tube amplifiers, which non-linearities cause undesirable intermodulation products in multi-carrier operation, predistortion circuits are usually superposed on the traveling wave tube amplifier.

Such predistortion circuits, whose amplitude and phase transfer characteristics are the inverse of the characteristics of traveling wave tube amplifiers, are known, for example, from European Patent No. EP 47 825, granted Oct. 3, 1984 and from a paper by G. Satoh et al, "Nonlinear Satellite Channel Design for QPSK/TDMA Transmission", 5th International Conference of Digital Satellite Communications, Mar. 23–26, 1981, Genoa, Italy. From the latter publication it is also known to connect a limiter network in cascade with a predistortion circuit. However, operating point changes due to ambient temperature changes and aging phenomena degrade the linearization process of such a traveling wave tube amplifier.

SUMMARY OF THE INVENTION

It is the object of the present invention, therefore, to provide a traveling wave tube transmission amplifier arrangement which limits the intermodulation distortions to a desired level, independently of drive, ambient temperature changes or aging.

The above object is basically achieved according to the present invention by an operating point-stabilized, linearized traveling wave tube transmission amplifier arrangement of the type including a traveling wave tube amplifier having the series connection of a predistortion circuit means for compensating for the non-linearities in the traveling wave tube amplifier, and a preamplifier with limiter circuit connected in the input signal path for the traveling wave tube amplifier, and which further includes: first means for limiting the output power of the traveling wave tube amplifier including a variable attenuator connected in the input signal path before the predistortion circuit means, means for deriving a signal which is a measure of the output power of the traveling wave tube amplifier, and a threshold controller means, which is responsive to the signal from the means for deriving, for providing an output control signal for controlling the variable attenuator; and second means, responsive to a remote control signal whose information content is determined by an analysis of an intermodulation measurement of the traveling wave tube transmission amplifier arrangement, for regulating the preamplifier with limiter circuit to provide compensation for aging effects.

According to embodiments of the invention, the means for deriving may include either a circuit means for providing a output signal which is proportional to the collector current supplied to the traveling wave tube amplifier and for feeding the collector current proportional signal to the input of the threshold controller means, or a circuit means for measuring the output power of the traveling wave tube and for feeding a signal proportional to the measured output power to the input of the threshold controller means.

Moreover, the traveling wave tube transmission amplifier arrangement includes means for providing temperature control in at least one of the predistortion circuit means, and the preamplifier with limiter circuit.

The invention presents the advantage that the linearization effect is maintained even in the event of overdrive, temperature change, aging effects or other environmental influences. Furthermore, limitation of the power output restricts the maximum required power supply. These characteristics are particularly important when using the transmission amplifier on board a satellite.

The invention discloses a simple and cost-effective design for the reduction of intermodulation distortions. Interferences that can be suppressed by on-board measures, such as operating point shifts due to temperature changes, are suppressed by automatic on-board control circuits. This does not cause an additional burden for the communication channels from and to the satellite. Only those interferences that cannot be automatically corrected on-board, such as aging effects, are effectively suppressed by adjustment of the transmission amplifier arrangement by means of a remote control signal.

DETAILED DESCRIPTION OF THE PREFERRED EMBODIMENTS

Figure 1:
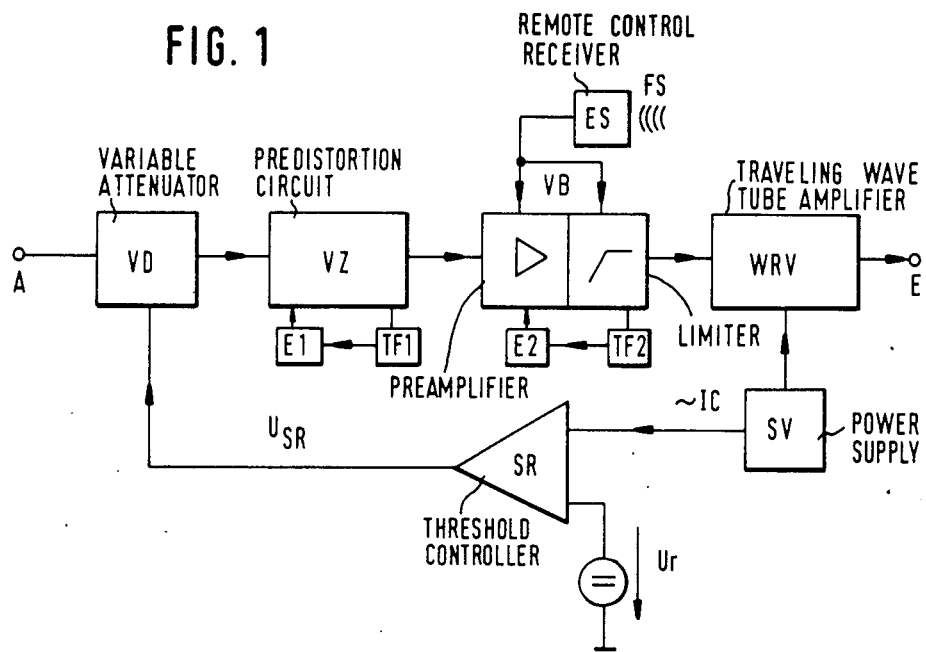
FIG. 1 is a block circuit diagram of one embodiment of a stabilized transmission amplifier arrangement according to the invention.

In the block circuit diagram for a traveling wave tube transmission amplifier to be used in a satellite shown in FIG. 1, a multiple carrier communication signal in the gigahertz range is fed to entry or input point A. This information signal at input A is relayed or fed via an attenuator VD with an adjustable attenuation factor α, to a predistortion circuit VZ. The structure of the predistortion circuit VZ is clarified further below in connection with FIG. 4. In a known manner, predistortion circuit VZ has an amplitude and phase characteristic that is inverse to the amplitude and phase characteristic of the subsequently connected traveling wave tube amplifier WRV and is thus suited to provide compensation for the latter's nonlinear distortions. Connected in the signal path between the output of the predistortion circuit VZ and the input of the traveling wave tube amplifier WRV is a circuit VB including a preamplifier with a limiter. The preamplifier is provided to adjust the output level of the predistortion circuit VZ to the required input level of the traveling wave tube transmission amplifier WRV. The limiter, which is connected in cascade with or integrated into the preamplifier, is provided to limit the input power of the traveling wave tube transmission amplifier WRV so that the traveling wave tube WRV cannot be pushed beyond the point at which its output power starts to drop. In a conventional manner, a power supply unit SV is provided to supply the required operating voltages and the collector current for the traveling wave tube WRV. The linearly amplified multiple carrier information signal is available at output terminal E.

According to the present invention, a signal is obtained from the power supply unit SV that is proportional to the collector current IC of the traveling wave tube. In this process, the collector current IC can be assumed to be a measure of the output power of the traveling wave tube WRV. This signal proportional to the collector current IC is used to control the variable attenuator VD via a threshold controller SR. More specifically the threshold controller SR generates a control signal $U_{SR}$ which raises the attenuation factor $\alpha$ of the attenuator VD whenever the signal proportional to the collector current IC exceeds a reference voltage Ur that is also fed to threshold controller SR. Consequently, in the event of a rise in the collector current IC, and the attending rise in the output power, because of overdrive at the signal input terminal A, the attenuation factor of attenuator VD is increased, which in turn counteracts an increase in the collector current IC. This results in limiting the power output and thus also the power input, of the traveling wave tube WRV.

In order to provide compensation for aging effects, which are evidenced by operating point shifts (amplification changes) and which cannot be compensated for by the above described control measure, a remote control signal FS is fed especially to the preamplifier or to the subsequently connected limiter of the circuit VB which, for input signals up to a certain level, must feature a strictly linear amplification and, above this particular level, should, if possible, feature an ideal limiter function. In this manner, there is optimum adaptation of either the linear limiter amplification or the limiter threshold to the characteristics of the traveling wave tube WRV and predistortion circuit VZ, independently of the aging phenomena of the system components. This remote control signal FS is obtained from an intermodulation measurement via a test signal. If the traveling wave tube transmission amplifier is an amplifier on board a satellite, this remote control signal FS consists suitably of a digital telecommand signal. To effect the intermodulation measurement, a multiple tone signal is transmitted to the satellite and after amplification in the traveling wave amplifier arrangement of FIG. 1 is retransmitted to the earth station. The now distorted signal received by the earth station from the satellite is evaluated with respect to this distortion. An appropriate remote control signal FS is then transmitted to the satellite receiving unit ES to optimize the adjustment of the preamplifier-limiter circuit VB.

The inter-modulation measurement can, for example, be effected in accordance with "IEEE Transactions on Communication Technology, Vol. COM-18, No. 1, 1970, pp. 37-48.

Figure 2:
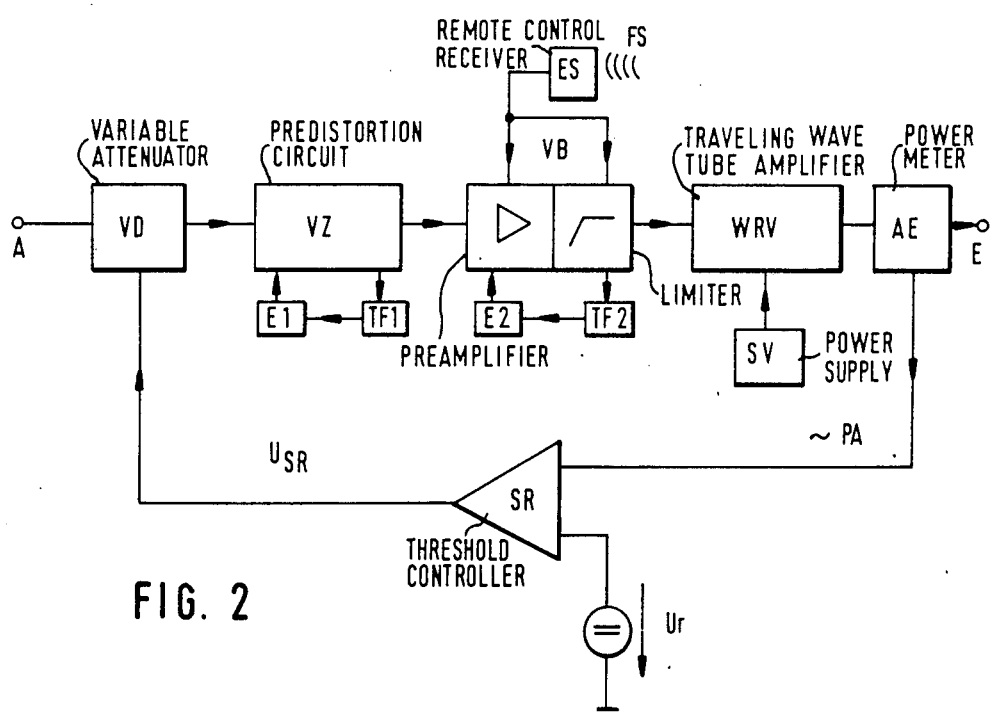
FIG. 2 is a block circuit diagram of a modified stabilized transmission amplifier arrangement according to the invention.

Except for the generation of the input signal for the threshold controller SR, the circuit of the modified transmission amplifier arrangement of FIG. 2 corresponds to the circuit shown in FIG. 1. In contrast to the exemplary embodiment of FIG. 1, the input or control signal in FIG. 2 for the threshold controller SR is not a signal produced by the power supply SV which is proportional to the collector current IC, but rather, a signal which is derived from the output signal of the traveling wave tube amplifier WRV, and more specifically in which is proportional to the power output PA of the traveling wave tube amplifier WRV. This control signal is obtained from an evaluation unit AE connected between the output of the traveling wave tube amplifier WRV and the output E of the amplifier arrangement. The evaluation unit AE can, for example, be a power detector (measurement of the mean square value) or a bolometer.

To reduce intermodulation distortions caused by temperature changes, at least one of the predistortion circuit VZ, the preamplifier with limiter circuit VB, and the traveling wave tube amplifier WRV is provided with a temperature control circuit. As shown in FIGS. 1 and 2, each of these units may be provided with a temperature control circuit. For this purpose temperature sensors TF1 and TF2, which are coupled with respective setting or adjustment elements E1 and E2, are associated respectively with the predistortion circuit VZ and the preamplifier with limiter circuit VB. These setting or adjustment elements E1 and E2 can, for example, be PIN diode attenuators, dual gate field effect transistors or devices for shifting the operating point of transistors.

More detailed circuit configurations for the units shown only in principle, i.e., in block form, in FIGS. 1 and 2 to this point, are shown in the remaining figures and are explained in greater detail below.

Figure 3:
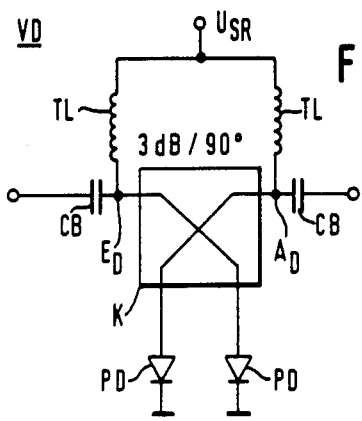
FIG. 3 is a schematic circuit diagram of the structure of a variable attenuator for use in the circuits of FIGS. 1 and 2.

As shown in FIG. 3, the variable attenuator VD consists of a 3dB, 90° coupler K which is terminated at two ports or gates by respective PIN diodes PD. The other two ports form the input terminal $E_D$ and output terminal AD of the coupler K. The terminals $E_D$ and $A_D$ are each connected via a respective direct current blocking capacitor CB to the input or output element respectively of the variable attenuator circuit VD. To adjust the attenuation of circuit VD, the output signal $U_{SR}$ of the threshold controller SR is fed to each of the PIN diodes PD via respective one quarter wavelength ($\lambda/4$) microstrip conductors TL which constitute an open circuit for the RF signal fed to the attenuator VD.

Figure 4:
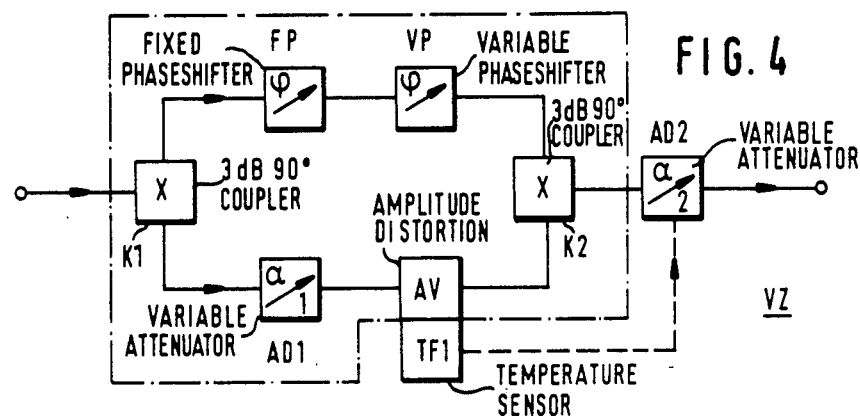
FIG. 4 is a block circuit diagram of the structure of a predistortion circuit for the embodiments of FIGS. 1 and 2.

The predistortion circuit V is represented schematically in FIG. 4, and consists of a bridge circuit having respective 3dB/90° couplers K1 and K2 at its input terminal and its output terminal. Coupler K1 divides the input signal to the predistortion circuit into two signal branches. These two branches are combined into an output signal by means of coupler K2. The upper linear branch contains the series connection of a fixed phase shifter FP and a variable phase shifter VP. The lower nonlinear branch contains the series connection of a variable attenuator AD1 and an amplitude distortion circuit AV, which is advantageously designed as a backward diode network. The above-described portion of predistortion circuit VZ, which is indicated in FIG. 4 by a dash-dot line, is known in principle, for example, from U.S. Pat. No. 4,068,186, issued Jan. 10, 1978. In accordance with the invention, the amplitude distortion circuit AV is coupled with the temperature sensor TF1.

When the temperature of amplitude distortion circuit AV rises, the output terminal of the temperature sensor TF1 provides a control signal, which adjusts a variable attenuator AD2 which corresponds to the setting or adjustment element E1 of FIGS. 1 and 2 and is connected between the output of coupler K2 and the output terminal of circuit VZ. This variable attenuator AD2 can, for example, be designed to consist of a PIN diode attenuator as shown in FIG. 3, of dual gate field effect transistors or of devices for shifting the operating point of transistors.

Figure 5:
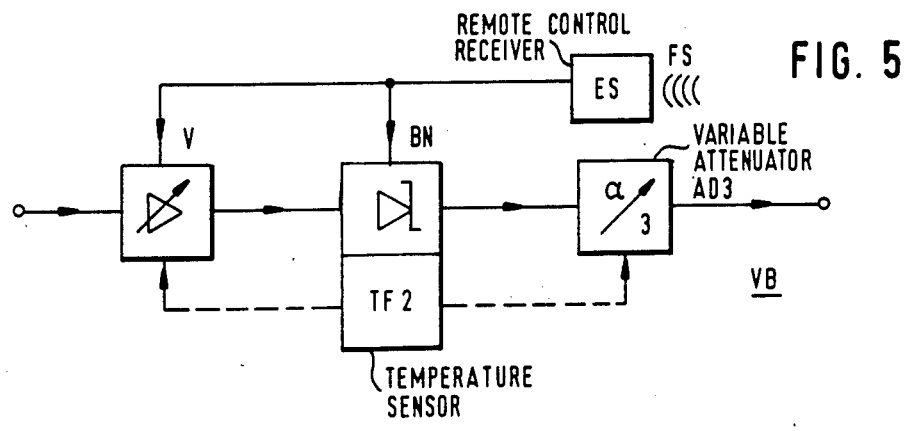
FIG. 5 is a block circuit diagram of the structure of the preamplifier with limiter of FIGS. 1 and 2.

Turning now to FIG. 5, there is shown the basic structure of the preamplifier with limiter circuit VB. This circuit VB consists of the series connection of an amplifier V with an adjustable gain, and a limiter network BN with a fixed or adjustable threshold, which preferably is an FET limiter, known, for instance, from the paper by G. Satoh et al "Nonlinear Satellite Channel Design for QPSK/TDMA Transmission," 5th International Conference of Digital Satellite Communications, Mar. 23-26, 1981, Genoa, Italy. Connected in series with the output of the limiter network BN is a variable attenuator AD3 which corresponds to the setting or adjustment element E2 of FIGS. 1 and 2 and which can again be designed like the attenuator of FIG. 3. A temperature sensor TF2 is coupled or associated with the limiter network BN to provide a control signal for adjusting the attenuation factor $a_3$ of the attenuator AD3 as a function of the temperature of the limiter network BN and also contributes to the adjustment of the gain of amplifier V. As described above, the remote control signal FS is transmitted to amplifier V and to the limiter network BN via the satellite receiving unit ES to adjust same to provide compensation for aging effects.

Figure 6:
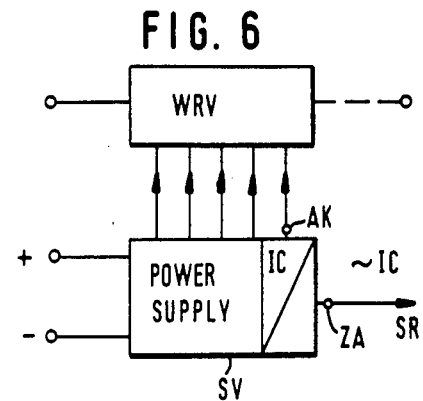
FIG. 6 is a block circuit diagram showing the structure of the power supply unit for the traveling wave tube transmission amplifier of FIG. 1.

As is shown in FIG. 6, power supply unit SV for the traveling wave tube transmission amplifier WRV is generally of conventional design in that it has output terminals for the necessary voltages of the traveling wave tube WRV and an output terminal AK for the collector current IC for the traveling wave tube WRV. For the embodiment of the invention shown in FIG. 1, the power supply SV is provided with an additional output terminal ZA, which, in a known manner, supplies a signal proportional to the collector current IC, and which is connected directly to the input of the threshold controller SR (FIG. 1).

It will be understood that the above description of the present invention is susceptible to various modifications, changes and adaptations, and the same are intended to be comprehended within the meaning and range of equivalents of the appended claims.

What is claimed is:

1. In an operating point-stabilized, linearized traveling wave tube transmission amplifier arrangement including a traveling wave tube amplifier having the series connection of a predistortion circuit means, for compensating for the non-linearities in said traveling wave tube amplifier, and a preamplifier with limiter circuit connected in the input signal path for said traveling wave tube amplifier; the improvement comprising: first means for limiting the output power of said traveling wave tube amplifier including a variable attenuator connected in said input signal path before said predistortion circuit means, means for deriving a signal which is a measure of the output power of said traveling wave tube amplifier, and a threshold controller means, which is responsive to said signal from said means for deriving, for providing an output control signal for controlling said variable attenuator; and second means, responsive to a remote control signal whose information content is determined by an analysis of an intermodulation measurement of said traveling wave tube transmission amplifier arrangement, for regulating said preamplifier with limiter circuit to provide compensation for aging effects.

2. A traveling wave tube transmission amplifier arrangement as defined in claim 1 wherein said means for deriving includes circuit means for providing an output signal which is proportional to the collector current supplied to said traveling wave tube amplifier and for feeding said collector current proportional signal to the input of said threshold controller means.

3. A traveling wave tube transmission amplifier arrangement as defined in claim 1 wherein said means for deriving includes circuit means for measuring the output power of said traveling wave tube amplifier and for feeding a signal proportional to the measured said output power to the input of said threshold controller means.

4. A traveling wave tube transmission amplifier arrangement as defined in claim 1, wherein said transmission amplifier arrangement is an amplifier aboard a satellite, and said remote control signal is a digital telecommand signal.

5. A traveling wave tube transmission amplifier arrangement as defined in claim 1 further comprising means for providing temperature compensation in at least one of said predistortion circuit means and said preamplifier with limiter circuit.

6. A traveling wave tube transmission amplifier arrangement as defined in claim 5 wherein: said preamplifier with limiter circuit includes a controllable gain preamplifier circuit with a subsequently connected limiter circuit; and said means for providing temperature compensation includes a variable attenuator connected to the output of said limiter circuit in said input signal path, and a temperature sensor means for sensing the temperature of said limiter circuit and for feeding a control signal to said variable attenuator to regulate its attenuation factor, and to said controllable gain preamplifier circuit to regulate its gain.

7. A traveling wave tube transmission amplifier arrangement as defined in claim 6, wherein said second means includes a remote control receiver having its output connected to control said controllable gain preamplifier circuit and said limiter circuit.

8. A traveling wave tube transmission amplifier arrangement as defined in claim 7, wherein said transmission amplifier arrangement is an amplifier aboard a satellite, and said remote control signal is a digital telecommand signal.

9. A traveling wave tube transmission amplifier arrangement as defined in claim 5 wherein: said predistortion circuit means includes a linear distortion path, a non-linear distortion path including circuit means for providing amplitude distortion, first coupler means for feeding an input signal to said predistortion circuit means to both of said distortion paths, and second coupler means for combining the output signals from both said distortion paths and for feeding the combined signal to the output of said predistortion circuit means; and said means for providing temperature compensation includes a variable attenuator connected to said output of said predistortion circuit means in said input signal path, and a temperature sensor means for sensing the temperature of said circuit means for providing amplitude distortion and for feeding a control signal to said variable attenuator to regulate its attenuation factor.

10. A traveling wave tube transmission amplifier arrangement as defined in claim 9 wherein said circuit means for providing amplitude distortion includes backward diodes.

11. A traveling wave tube transmission amplifier arrangement as defined in claim 1, wherein backward diodes are provided in said predistortion circuit means for the generation of amplitude predistortion.

* * * * *